United States Patent [19]

Whidden

[11] 4,414,534
[45] Nov. 8, 1983

[54] RADIO FREQUENCY DETECTION CIRCUITRY HAVING NOISE DISCRIMINATION CAPABILITY

[76] Inventor: Glenn H. Whidden, 13214 L'Enfant Dr., Fort Washington, Md. 20022

[21] Appl. No.: 302,116

[22] Filed: Sep. 14, 1981

[51] Int. Cl.³ .................... G08B 13/00; H03K 9/06; H04B 17/00
[52] U.S. Cl. .................. 340/310 A; 340/658; 307/354; 328/140
[58] Field of Search .................. 340/310 A, 538, 658; 455/226, 229; 329/11, 126; 328/140, 149, 150; 307/354

[56] References Cited

U.S. PATENT DOCUMENTS

| | | | |
|---|---|---|---|
| 3,761,809 | 9/1973 | Lockett et al. | 329/126 |
| 3,818,466 | 6/1974 | Honda | 340/538 |
| 3,940,699 | 2/1976 | Emgushov | 340/658 |
| 4,024,528 | 5/1977 | Boggs . | |
| 4,047,114 | 9/1977 | Lane et al. | 329/126 |
| 4,143,323 | 3/1979 | Cieslak et al. | 340/658 |
| 4,300,125 | 11/1981 | Loshing et al. | 340/310 A |

Primary Examiner—Donald J. Yusko
Attorney, Agent, or Firm—Cushman, Darby & Cushman

[57] ABSTRACT

In a radio frequency detector, a high pass filter is provided to attenuate any undesired low frequencies present in signals applied to the filter. The filter output serves as an input to an AND gate. A low pass filter directs power line voltage to a one-shot multivibrator which is biased to respond to the positive-going zero crossing of the power supply to produce an output of limited duration which is applied to the gate as an enabling input. The output of the gate is joined to a second one-shot multivibrator which responds to a pulse generated when the gate is fully enabled causing energization of an alarm actuator.

An additional pulse detector optionally is interposed between the gate and the second one-shot to eliminate any random pulses which may occur at the gate output at a frequency below r.f. level, and an additional filter optionally is included between the high pass filter and the AND gate to eliminate the effects on the circuitry arrangement of high frequencies above a predetermined level.

10 Claims, 5 Drawing Figures

RADIO FREQUENCY DETECTION CIRCUITRY HAVING NOISE DISCRIMINATION CAPABILITY

BACKGROUND OF THE INVENTION

One conventional technique used in electronic eavesdropping is the employment of a carrier current transmitter to send sounds that have been picked up by a hidden microphone to a remote point over existing electrical power circuits. The power line is convenient not only as a source of power for the eavesdropping transmitter, but also as a transmission medium since it usually travels to a point outside the surveillance area where a carrier current receiver can be connected to the line and operated.

Carrier current transmitters for such an application traditionally operate at frequencies over 20 kHz and below 500 kHz. The high frequency limit of about 500 kHz is observed because the signal from the eavesdropping transmitter will radiate to some extent from the power line, and thus the surveillance device could easily be discovered using a radio operating in the standard broadcast bands if higher frequencies were used. Similarly, the frequency of 455 kHz that is commonly used as an IF in such receivers is avoided.

FM generally is employed in carrier current eavesdropping transmitters as it allows more immunity from noise interference. However, AM has been used successfully at times.

When attempting to detect the presence of carrier current eavesdropping signals on a power line, a tunable radio receiver or a broadband r.f. detector is used. Although the latter device can provide quick results, it reproduces much of the electrical noise existing on the line. Such noise can make weak signals difficult to detect and identify and if audible in the room, can be quite disturbing to occupants of that room. In addition, it has not been possible to distinguish a signal that emanates from an eavesdropping transmitter from electrical noise when using a detector operating unattended by a human operator. As such eavesdropping transmitters, in some cases, can be actuated from a remote point by the eavesdropper, it is desirable to have a detection device that can distinguish between r.f. signals and noise and that can indicate automatically (i.e., without requiring the presence of a human operator) when an r.f. signal appears on the line being monitored. It also is highly desirable that the detection device not make sounds or otherwise radiate energy that might alert the eavesdropper to the detection effort.

In summary, it is an object of the invention to provide a silently operating detection device that can automatically detect signals between 20 kHz and 500 kHz when connected to a power line in an area to be protected from electronic eavesdropping.

SUMMARY OF THE INVENTION

Briefly, the invention comprises a circuitry arrangement which is incorporated in a receiver, or a broadband r.f. detector, having conventional demodulators, amplifiers and the like, by which signal energy from a power line is applied to a high pass filter which attenuates low frequency signals, e.g. below 20 kHz. The output of this filter is supplied as a first input to an AND gate. Also connected to the power line is a low pass filter which passes the power line voltage, typically having a frequency of 60 Hz, to a one-shot multivibrator which responds to the positive-going zero crossing of the a.c. power supply to produce a relatively short output pulse, or "window", which is supplied as a second input to the AND gate. The occurrence of pulses on both of the inputs of the gate produces an output pulse which actuates a second one-shot multivibrator which serves as a pulse stretcher to produce an output for operating a suitable alarm.

If desired, a random pulse detector may be interposed between the AND gate and the second one-shot to eliminate low frequency noise pulse which occasionally may occur during the "window" established by the first one-shot. Additionally, a further filter arrangement may be located in the path between the high pass filter and the AND gate to eliminate the effects of high frequency signals, e.g. above 500 kHz, which may be carried on the line.

DETAIL DESCRIPTION OF THE INVENTION

The invention will be described in greater detail with respect to the accompanying drawings wherein.

Figure 1:
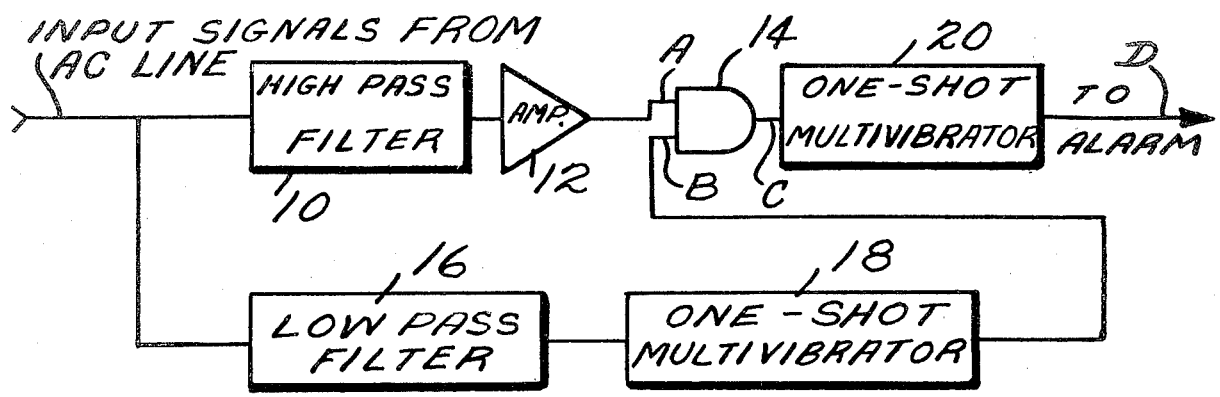
FIG. 1 is a block diagram of a basic circuitry arrangement according to the invention.
Figure 2:
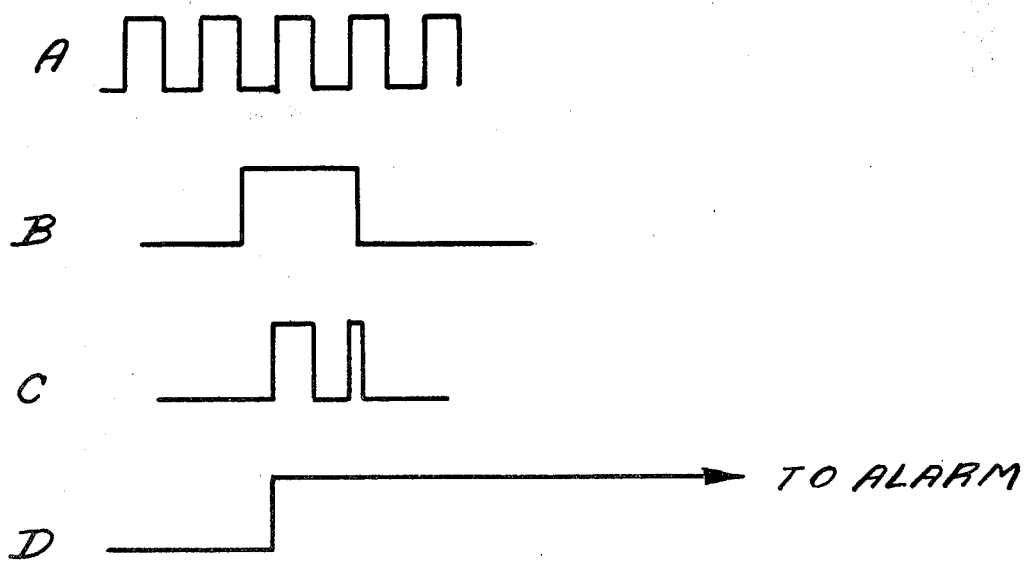
FIG. 2 is a timing diagram illustrating the operation of the circuitry shown in FIG. 1.

Referring to FIG. 1, signal energy on an electrical power line is directed to a conventional high pass filter 10 which attenuates frequencies below r.f. levels, e.g. under 20 kHz. The output of filter 10 is a signal passed through an amplifier 12. The amplifier shapes and amplifies the signal and applies it as a first input to AND gate 14. This input signal is illustrated as A in FIG. 2.

The power line also is connected to a low pass filter 16 which attenuates frequencies above that of the power supply, which typically is 60 Hz. The output of filter 16 is applied to a first one-shot multivibrator 18. This one-shot is biased in conventional fashion to respond to the positive-going zero crossing of the power supply to produce a single output pulse for each cycle of power supply frequency. The pulse length selected is 75 microseconds, which is one and a half times the length of one cycle of the 20 kHz signal, the lowest frequency passed by filter 10 in this illustrative embodiment. The output of one-shot 18 is illustrated as B in FIG. 2. It is applied to AND gate 14 as a second input.

The selection of 75 microseconds as the duration of pulse B insures that the lowest frequency information signal to be detected can be passed through AND gate 14 under any condition of phase difference between the power supply frequency and signals at 20 kHz or higher.

It is well known that noise on an electrical line (which may be caused, for example, by the presence of an electrical device on the line, such as a motor) infrequently occurs at the beginning of each power waveform half-cycle. Representative of such prior knowledge of this fact is U.S. Pat. No. 4,024,528 which was issued to Luther M. Boggs et al. on May 17, 1977. For this reason, the 75 microsecond "window" B, produced by one-shot 18 at the positive-going zero crossing of the power waveform, partially conditions AND gate 14 during a time interval when the likelihood of there being a noise signal is remote. Consequently, when gate 14 is simultaneously enabled by inputs A and B to produce an output C from the gate (see FIG. 2), the output C is a reliable indicator that the power line is being used to transmit r.f. information.

Output C from gate 14 is applied to a second one-shot multivibrator 20 which produces an output D (FIG. 2) for actuating a suitable alarm to indicate that the power line is being used for eavesdropping or other information transmission purposes.

As stated previously, it is possible for an infrequent random noise pulse to occur during the interval of the "window" pulse B and to pass filter 10 so as to produce an output C from AND gate 14. To prevent such a noise pulse from causing the alarm to be actuated, a suitable pulse detector can be interposed in the detection circuitry of FIG. 1 between gate 14 and the second one-shot 20. The circuit arrangement for such a pulse detector is shown in FIG. 3.

Figure 3:
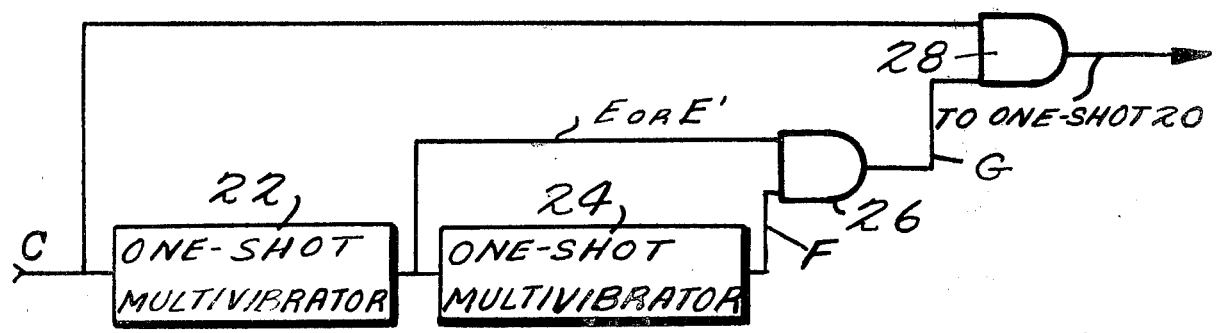
FIG. 3 is a block diagram of a random noise pulse detector which may be used in conjunction with the arrangement illustrated in FIG. 1.

Referring to FIG. 3, the output C from gate 14 in FIG. 1 is applied as input to a one-shot multivibrator 22 which, like the one-shot 18 previously described, is capable of producing a 75 microsecond output pulse. However, unlike one-shot 18, if a second pulse C is applied to the input of one-shot 22 during this 75 microsecond interval, the one-shot is retriggered and a new 75 microsecond interval is initiated. Thus, if a signal having a frequency of 20 kHz or higher is applied to the input of one-shot 22, its output E will be a pulse having a duration which extends 75 microseconds beyond the beginning of the last pulse applied to sustain an output pulse from the one-shot. This timing relationship is shown in FIG. 4.

Figure 4:
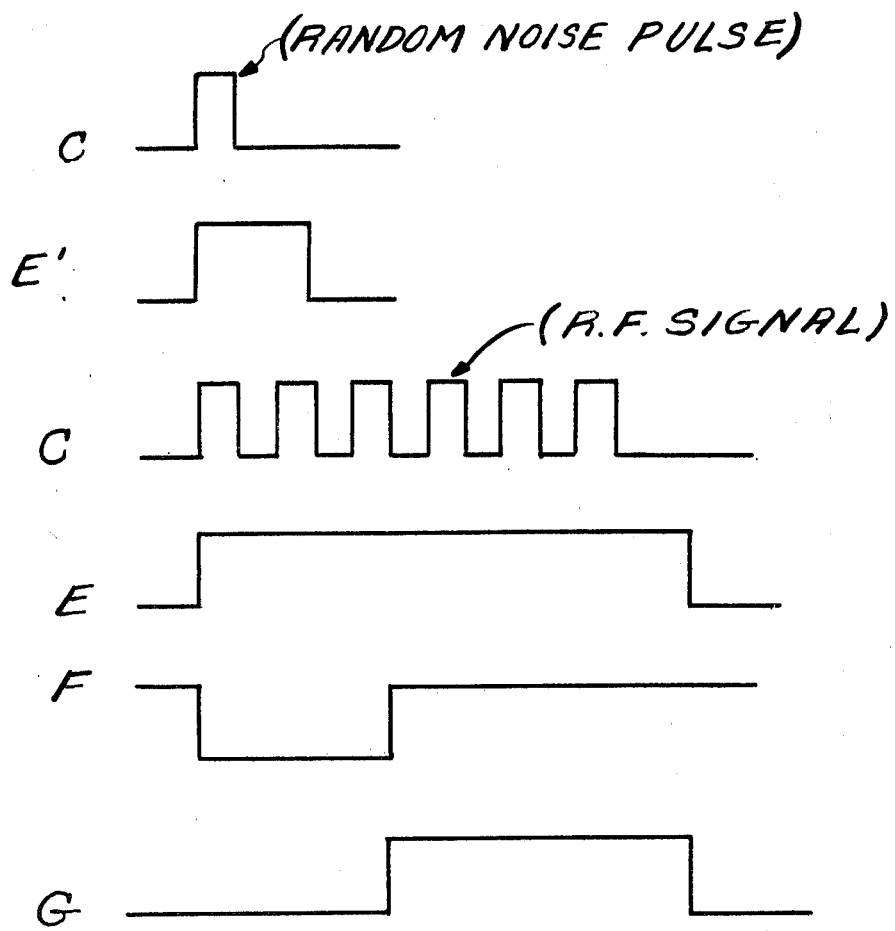
FIG. 4 is a timing diagram illustrating the operation of the random noise pulse detector shown in FIG. 3.

If, on the other hand, only a single pulse C is applied to the one-shot 22 during a 75 microsecond interval (as would be the case if pulse C were a random noise pulse), the output from the one-shot would be a pulse of 75 microsecond duration, as indicated by the waveform E' in FIG. 4.

The output of the one-shot 22 is applied as inputs to a further one-shot multivibrator 24 and to an AND gate 26. The output of one-shot 24 is connected as a second input to gate 26. The one-shot 24 is arranged to operate with its output at a voltage normally at a level (HIGH) to partially enable gate 26, but in response to a pulse output from one-shot 22, the output F drops to a level (LOW) insufficient to partially enable the gate. The duration of the latter state is 125 microseconds, which is two and a half times the duration of one cycle of 20 kHz. Again, this timing relationship is shown in FIG. 4.

In addition to being applied to one-shot 22, the output C from gate 14 in FIG. 1 is connected to the input of a further AND gate 28. A second input to gate 28 is the output of gate 26.

In operation, a single random noise pulse occurring as output C of gate 14 in FIG. 1 will cause one-shot 22 to produce an output E' to partially enable gate 26. However, the same output E' triggers one-shot 24 in such a manner as to produce an output F which prevents the gate from being fully enabled for at least 125 microseconds. Since E' has a duration of only 75 microseconds, gate 26 cannot be completely enabled so as to condition gate 28 to supply a pulse input to one-shot 20 of FIG. 1. Thus, the possibility of any infrequently occurring random noise pulse actuating the alarm is eliminated.

On the other hand, if the output C from gate 14 is a r.f. signal of 20 kHz or higher, the occurrence of one or more additional pulses at the input of one-shot 22 within the initial 75 microsecond interval of the one-shot output E will cause one-shot 22 to be retriggered to extend the duration of its output E longer than 125 microseconds. Accordingly, as the output F of one-shot 24 returns to its gate-enabling level (HIGH) at the end of its single, non-enabling (LOW) period of 125 microseconds, gate 26 is enabled to produce an output G (FIG. 4) so as to partially enable gate 28 whereby r.f. pulses on the other input of gate 28 are passed to one-shot 20 (FIG. 1) to permit the alarm to be operated.

Figure 5:
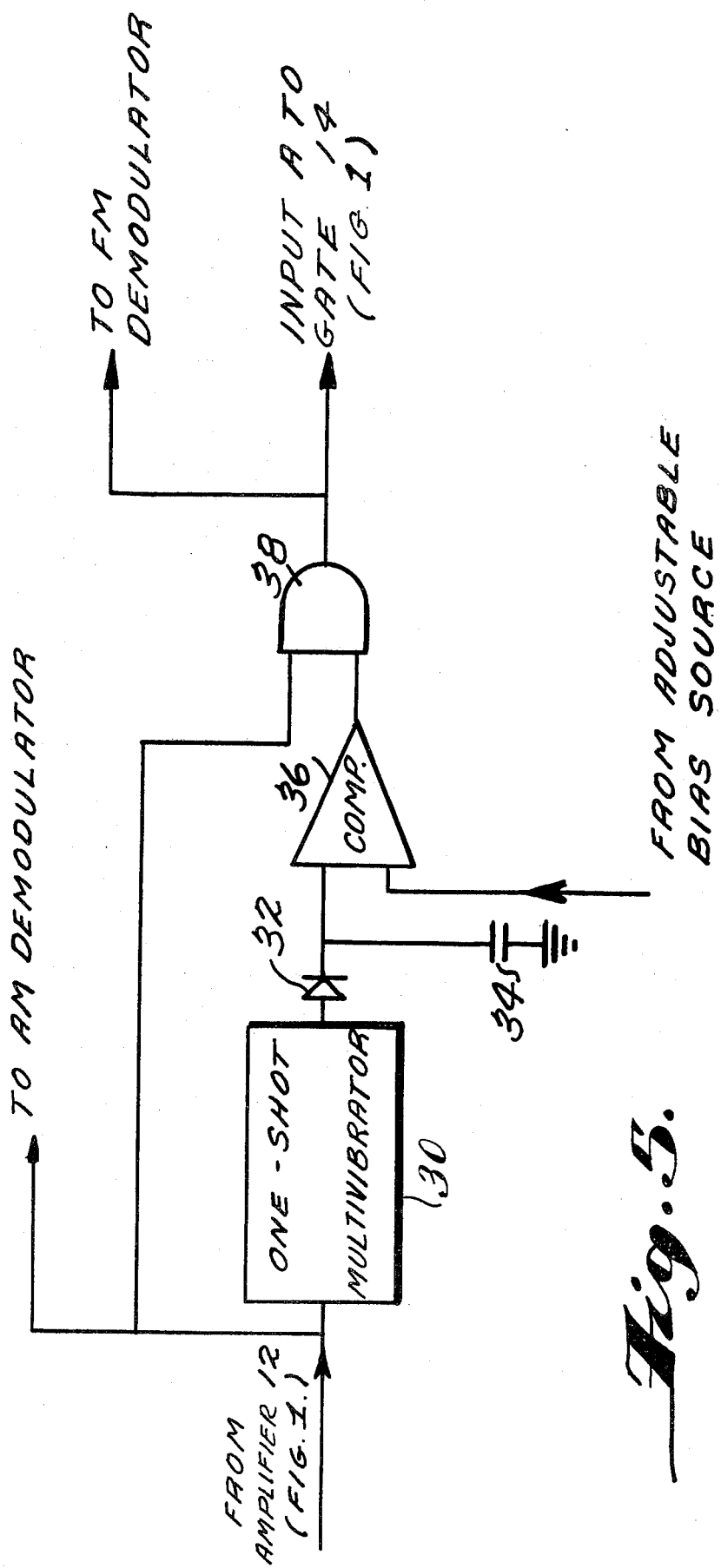
FIG. 5 is a block diagram of a further filter which may be used in conjunction with the arrangement illustrated in FIG. 1.

A further optional arrangement which may be employed is illustrated in FIG. 5. The purpose of this additional circuitry is to attenuate high frequencies above a certain level so as to eliminate their unwanted effects on the detector. Typically, the high frequencies eliminated are those above 500 kHz.

Referring to FIG. 5, the filtering arrangement disclosed comprises a further one-shot multivibrator 30 connected to the output of the amplifier 12 illustrated in FIG. 1. The multivibrator 30 is of the known type which produces separate and distinct pulses up to at least 800 kHz. The pulses produced by this multivibrator are applied through a diode 32 to a grounded capacitor 34 whereby at the junction of these two elements a d.c. voltage is produced which is proportional to the frequency at which the pulses from multivibrator 30 occur. This d.c. voltage is applied as one input to a comparator 36. The second input to the comparator is an adjustable source of biasing which is set so that the comparator will produce a particular output voltage level (LOW) when the multivibrator operates above a predetermined frequency (e.g. 500 kHz), while the output of the comparator is at a different voltage level (HIGH) when the multivibrators's output is below the predetermined frequency.

The output of comparator 36 is applied as one input to a further AND gate 38. The other input of gate 38 is the output of amplifier 12 (FIG. 1). When the output of comparator 36 is HIGH, as will be the case when signals below 500 kHz occur (or when no signals exist at all), the AND gate 38 is partially enabled. Consequently, any signals appearing at the output of amplifier 12 will be passed by gate 38 and will be applied as input A to be processed as described above in connection with the discussion of FIG. 1. Of course, when the output of comparator 36 is LOW because of the occurrence of signals above 500 kHz on the line, gate 38 will be disabled, thereby preventing signals from amplifier 12 being passed by the gate for processing.

The arrangements which have been described remain dormant unless pulses occurring at the rate of 20 kHz or higher are encountered. Random noise pulses occurring at a lower frequency are prevented from actuating the alarm.

What is claimed is:

1. A circuit arrangement for use in detecting the presence of radio frequency signal transmission on an electrical power line, comprising:

a filter operatively related to said line, said filter being adapted to pass radio frequency signals while rejecting signals of lower frequency;

means for applying signals passed by said filter to a first input of a gate;

means connected to said line and responsive to a zero crossing of a power supply voltage applied to the line for producing a gating signal of predetermined duration commencing at the occurrence of said zero crossing;

means for applying the gating signal to a second input of said gate; and means responsive to an output signal from said gate, obtained upon coincidence of signals on said first and second gate inputs, for energizing an alarm actuator.

2. A circuit arrangement as set forth in claim 1, further comprising:

an additional filter, connected to said power line, for passing said power supply voltage to the gating signal producing means while rejecting higher frequencies.

3. A circuit arrangement as set forth in claim 1, wherein said means for producing the gating signal is a one-shot multivibrator.

4. A circuit arrangement as set forth in claim 3, wherein the duration of said gating signal is one and a half times the duration of a cycle of the lowest radio frequency signal passed by said filter.

5. A circuit arrangement as set forth in claim 4, further comprising:

an additional filter, connected to said power line, for passing said power supply voltage to the gating signal producing means while rejecting higher frequencies.

6. A circuit arrangement as set forth in claim 1, wherein said means for applying signals to the first input of the gate includes an additional filter for rejecting radio frequency signals above a predetermined level.

7. A circuit arrangement as set forth in claim 6, wherein said additional filter comprises:

a one-shot multivibrator joined to said first-mentioned filter for producing output pulses at a frequency related to the radio frequency signals applied thereto;

a diode-capacitor circuit joined to the multivibrator for producing an output signal having a voltage level related to the frequency of the output pulses from the multivibrator;

a comparator responsive to the voltage level of the output signal from the diode-capacitor circuit and to an adjustable bias source for producing a comparator output; and an additional gate joined to said comparator and to the first-mentioned filter for producing an output for application as said first input of the first-mentioned gate.

8. A circuit arrangement as set forth in any one of claims 1 to 6, wherein said means responsive to the output signal from said gate comprises:

a second gate having a first input joined to an output terminal of said first-mentioned gate;

a first pulse generating means also joined to said output terminal, said pulse generating means producing an output signal of fixed duration in response to a single signal applied thereto by said first-mentioned gate but being responsive to additional signals applied thereto during the interval of fixed duration for extending the duration of the output signal;

a second pulse generating means connected to the first pulse generating means and responsive to the output signal therefrom, said second pulse generating means producing an output of fixed duration regardless of the duration of the output signal from said first pulse generating means, the fixed duration of the output from the second pulse generating means being greater than said fixed duration of the output signal from the first pulse generating means;

means for joining the outputs of said first and second pulse generating means to respective inputs of a third gate, said output signal from the first pulse generating means partially enabling the third gate while the output of fixed duration from the second pulse generating means disables the third gate;

means joining an output terminal of the third gate to a second input terminal of said second gate; and means connecting an output of said second gate to the alarm actuator.

9. A circuit arrangement as set forth in claim 8, wherein the fixed duration of the output from the second pulse generating means is two and a half times the duration of a cycle of the lowest radio frequency signal passed by said filter.

10. A circuit arrangement as set forth in claim 9, wherein said fixed duration of the output signal produced by the first pulse generating means in response to a single signal applied thereto is one and a half times the duration of a cycle of the lowest radio frequency signal passed by said filter.

* * * * *